United States Patent
Chang et al.

(10) Patent No.: US 7,869,283 B2
(45) Date of Patent: Jan. 11, 2011

(54) METHOD FOR DETERMINING NATIVE THRESHOLD VOLTAGE OF NONVOLATILE MEMORY

(75) Inventors: Chao-Hua Chang, Taichung County (TW); Chien-Min Wu, Hsinchu (TW)

(73) Assignee: Windbond Electronics Corp., Taichung County (TW)

( * ) Notice: Subject to any disclaimer, the term of this patent is extended or adjusted under 35 U.S.C. 154(b) by 139 days.

(21) Appl. No.: 12/425,650

(22) Filed: Apr. 17, 2009

(65) Prior Publication Data
US 2010/0265774 A1  Oct. 21, 2010

(51) Int. Cl.
*G11C 16/04* (2006.01)
(52) U.S. Cl. .............................. 365/185.24; 365/185.28; 365/185.29; 365/185.33
(58) Field of Classification Search ............. 365/185.24
See application file for complete search history.

(56) References Cited

U.S. PATENT DOCUMENTS

| | | | |
|---|---|---|---|
| 6,768,165 B1 * | 7/2004 | Eitan | 257/324 |
| 7,123,532 B2 * | 10/2006 | Lusky et al. | 365/210.1 |
| 2006/0227608 A1 * | 10/2006 | Lusky | 365/185.14 |
| 2007/0258289 A1 * | 11/2007 | Lue | 365/185.18 |

\* cited by examiner

*Primary Examiner*—Son L Mai
(74) *Attorney, Agent, or Firm*—J.C. Patents

(57) ABSTRACT

A method for determining native threshold voltage of nonvolatile memory includes following steps. A memory cell including a control gate, a charge storage layer, a source region, and a drain region is provided. A programming operation is performed on the memory cell by using F-N tunneling effect to obtain a programming curve of time versus threshold voltage. In the programming operation, a positive voltage is applied to the control gate. An erase operation is performed on the memory cell by using F-N tunneling effect to obtain an erasure curve of time versus threshold voltage. In the erase operation, a negative voltage is applied to the control gate. The absolute values of the positive voltage and the negative voltage are the same. The native threshold voltage of memory cell is determined from the cross point of the programming curve and the erasure curve.

6 Claims, 4 Drawing Sheets

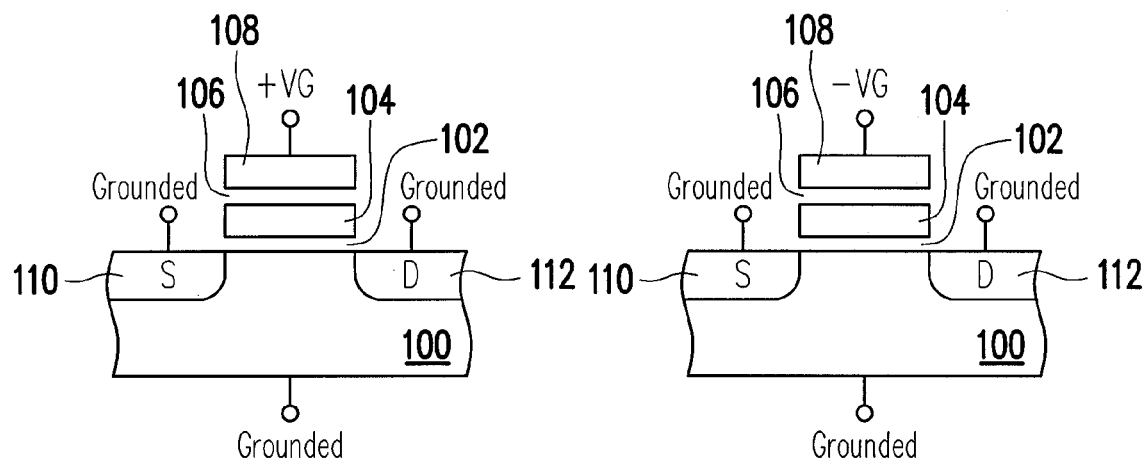
FIG. 1A
FIG. 1B
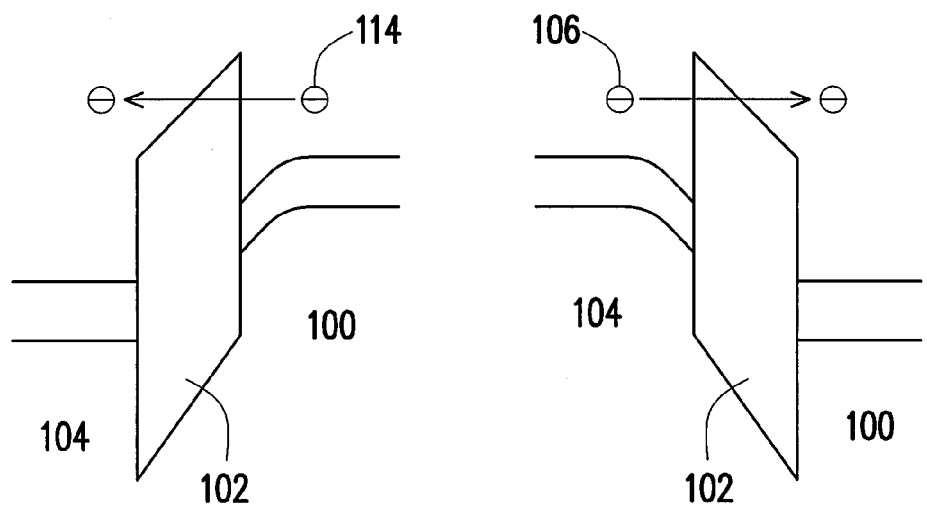
FIG. 2A
FIG. 2B

US 7,869,283 B2

METHOD FOR DETERMINING NATIVE THRESHOLD VOLTAGE OF NONVOLATILE MEMORY

BACKGROUND OF THE INVENTION

1. Field of the Invention

The present invention relates to a method of determining a semiconductor memory device. More particularly, the present invention relates to a method of determining a native threshold voltage of a nonvolatile memory.

2. Description of Related Art

A typical flash memory has a floating gate and a control gate fabricated using doped polysilicon. When the memory is programmed, suitable programmed voltages are applied to the source region, the drain region, and the control gate respectively. Next, electrons will flow from the source region to the drain region through channel of memory cell. In the process, a portion of the electrons will penetrate a tunneling oxide layer below the polysilicon floating gate layer. Here, the electrons enter and distribute uniformly in the entire polysilicon floating gate layer. The phenomenon of electrons penetrating the tunneling oxide layer to enter the polysilicon floating gate layer is called a tunneling effect. The tunneling effect can be categorized into a channel hot-electron injection and a Fowler-Nordheim tunneling (F-N tunneling). The flash memory is usually programmed with the channel hot-electron injection, and erased with the F-N tunneling by passing the channel region or the side of the source region.

In general, after the flash memory has been manufactured, as each memory cell may be affected by the manufacturing process to result in uneven threshold voltages, the memory will have a larger distribution of the threshold voltages that may cause difficulty in use. Hence, before the shipment, the UV light is usually applied to irradiate the flash memory completely, such that every memory cell of the flash memory is at a stage of low threshold voltage (Low |Vt|) to achieve an initialization of devices. After the memory cell has been irradiated completely by the UV light, the threshold voltage maintained is referred as a native threshold voltage.

However, in the trend of increasing the integration of memory devices, the size of memory cells is also relatively decreased. Moreover, the memory cell is usually covered by high metal density. When the memory is exposed to the UV light, the UV light is blocked by metal layers, so the memory cell will not be irradiated easily. Consequently, the initialization of devices in the memory can not be accomplished. Furthermore, as the UV light can not irradiate the memory cell completely, the memory cell can not reach the stage of the native threshold voltage and the native threshold voltage of the memory cell can not be determined.

SUMMARY OF THE INVENTION

The present invention provides a method of determining a native threshold voltage of a nonvolatile memory, where the native threshold voltage of the nonvolatile memory can be easily determined.

The present invention provides a method of determining a native threshold voltage of a nonvolatile memory. The method includes the following steps. Firstly, a memory cell having a control gate, a charge storage layer, a source region, and a drain region is provided. Next, a programming operation is performed on the memory cell by using an F-N tunneling effect to obtain a programming curve of time versus threshold voltage. In the programming operation, a first voltage is applied to the control gate. Thereafter, an erase operation is performed on the memory cell by using the F-N tunneling effect to obtain an erasure curve of time versus threshold voltage. In the erase operation, a second voltage is applied to the control gate. Here, the absolute values of the second voltage and the first voltage are the same, but the polarities are opposite. Finally, the native threshold voltage of the memory cell is determined from a cross point of the programming curve and the erasure curve.

In one embodiment of the present invention, the first voltage is between 8V and 20V.

In one embodiment of the present invention, the second voltage is between −8V and −20V.

In one embodiment of the present invention, the source region and the drain region are grounded or applied with a voltage of 0V in the programming operation.

In one embodiment of the present invention, the source region and the drain region are grounded or applied with a voltage of 0V in the erase operation.

In one embodiment of the present invention, the memory cell is a flash memory cell.

In light of the foregoing, since the method of determining the native threshold voltage of the nonvolatile memory in the present invention only requires one programming operation and one erase operation, thus, the method in the present invention can determine the native threshold voltage of the nonvolatile memory easily. Furthermore, the native threshold voltage of the memory cell can still be easily determined when the memory cell is covered with a high-density metal layer.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A and FIG. 1B are the respective schematic diagrams of a programming operation and an erase operation of a nonvolatile memory.

FIG. 2A and FIG. 2B are the respective schematic diagrams of energy bands in a programming operation and an erase operation of the nonvolatile memory.

DESCRIPTION OF EMBODIMENTS

Figure 3:
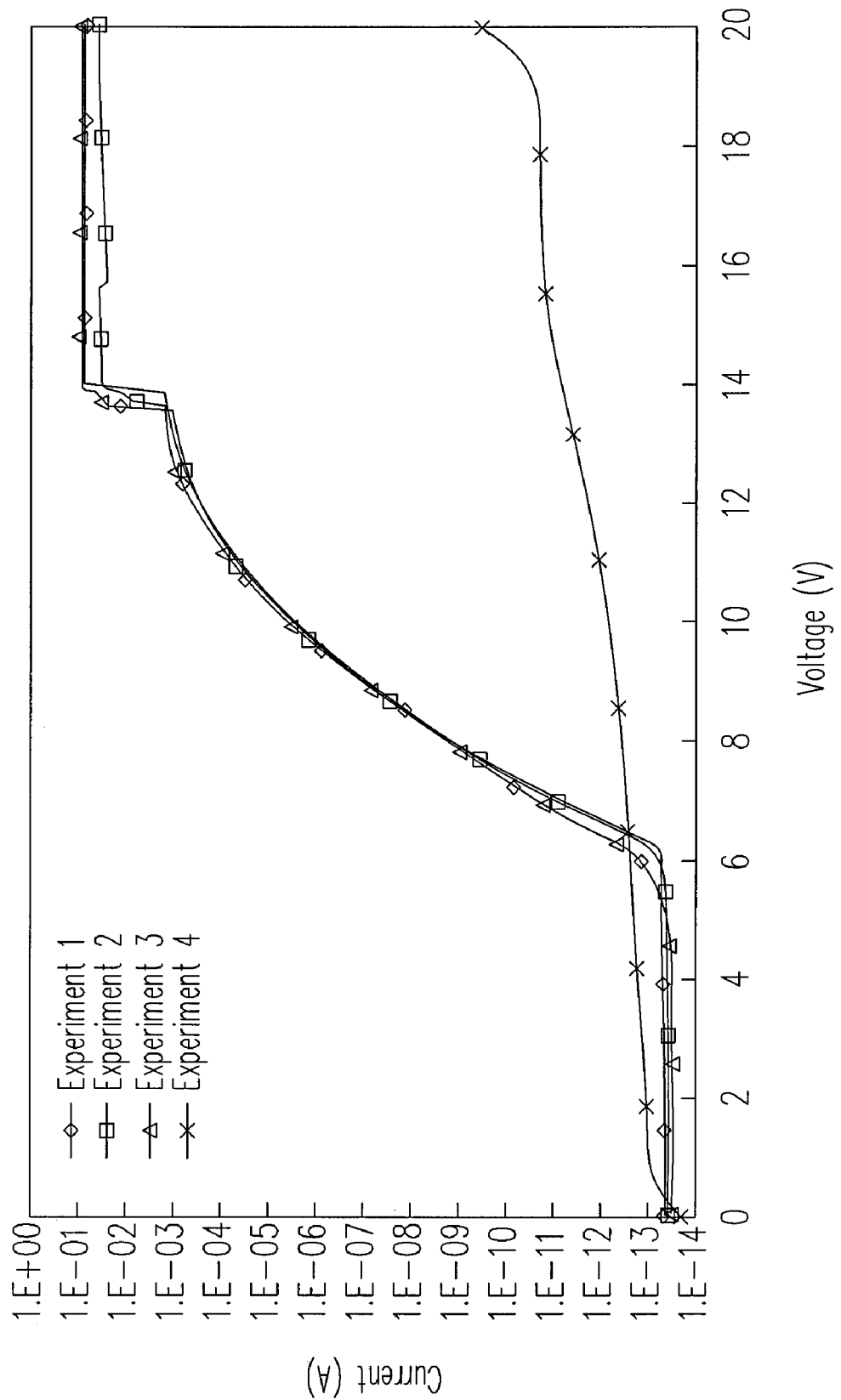
FIG. 3 illustrates a relationship of a voltage applied to the gate and a Fowler-Nordheim tunneling current.

FIG. 1A and FIG. 1B are the respective schematic diagrams of a programming operation and an erase operation of a nonvolatile memory. FIG. 2A and FIG. 2B are the respective schematic diagrams of energy bands in a programming operation and an erase operation of the nonvolatile memory.

Referring to FIG. 1A and FIG. 1B, the nonvolatile memory is, for example, assembled by a substrate 100, a tunneling dielectric layer 102, a charge storage layer 104, an inter-gate dielectric layer 106, a control gate 108, a source region 110, and a drain region 112.

The tunneling dielectric layer 102, the charge storage layer 104, the inter-gate dielectric layer 106, and the control gate 108 are sequentially disposed on the substrate 100, for example. Moreover, a material of the tunneling dielectric layer 102 is, for example, silicon oxide. A material of the charge storage layer 104 includes, for example, doped polysilicon. Furthermore, a material of the inter-gate dielectric layer 106 is, for example, silicon oxide or silicon oxide/silicon nitride/silicon oxide. The source region 110 and the drain region 112 are disposed within the substrate 100 at the two sides of the gate 108.

Referring to FIG. 1A and FIG. 2A, when programming the memory cell, the control gate 108 and the substrate 100 have an 8V to 20V voltage difference that induces a Fowler-Nordheim tunneling effect (F-N tunneling effect), such that electrons 114 enter the charge storage layer 104 through the substrate 100. To give an example, a +VG voltage (8V to 20V) is applied to the control gate 108, such that the substrate 100, the source region 110, and the drain region 112 are grounded or applied with a voltage of 0V to program the memory cell by using the F-N tunneling effect.

Referring to FIG. 1B and FIG. 2B, when erasing the memory, the substrate 100 and the control gate 108 have an 8V to 20V voltage difference that induces a F-N tunneling effect, such that the electrons 114 are ejected to the substrate 100 from the charge storage layer 104. To give an example, a −VG voltage (−8V to −20V) is applied to the control gate 108, such that the substrate 100, the source region 110, and the drain region 112 are grounded or applied with a voltage of 0V to erase the memory cell by using the F-N tunneling effect.

Furthermore, as illustrated in FIG. 1A and FIG. 1B, when programming or erasing the memory cell, the source region 110 and the drain region 112 are grounded or applied with a voltage of 0V.

FIG. 3 illustrates a relationship of a voltage (0~±20V) applied to the gate and a F-N tunneling current. Experiment 1 (symbol ◊) represents that a negative voltage is applied to the gate, so that the source region and the drain region are grounded. Experiment 2 (symbol □) represents that a positive voltage is applied to the gate, so that the source region and the drain region are grounded. Experiment 3 (symbol Δ) represents that a negative voltage is applied to the gate, so that the source region and the drain region are floated. Experiment 4 (symbol ×) represents that a positive voltage is applied to the gate, so that the source region and the drain region are floating. In FIG. 3, a horizontal axis represents the absolute value of the voltage applied, and a vertical axis represents the F-N tunneling current determined in the inter-gate dielectric layer.

The curves of experiments 1-3 are illustrated in FIG. 3. When a voltage (±8~±20V) is applied to the gate, the F-N tunneling current increases rapidly as the voltage increases. When the voltage applied to the gate is ±20V, the F-N tunneling currents of experiments 1-3 can reach 0.1~0.01 Amperes. However, as illustrated by the curve in experiment 4, although the F-N tunneling current increases with the voltage applied to the gate, the range of the increase is very small. When the voltage applied to the gate is a 20V voltage, the F-N tunneling current of experiment 4 will only reach $1 \times 10^{-9}$~$1 \times 10^{-10}$ Amperes and not be generating a large F-N tunneling current. This result demonstrates that if the source region and the drain region are floated, a greater amount of electrons will not be induced to generate a large F-N tunneling current when the gate is applied with a positive voltage. Therefore, in the method of determining the native threshold voltage of the nonvolatile memory in the present invention, the source region and the drain region are preferably grounded or applied with a voltage of 0V during the programming operation and the erase operation.

Figure 4:
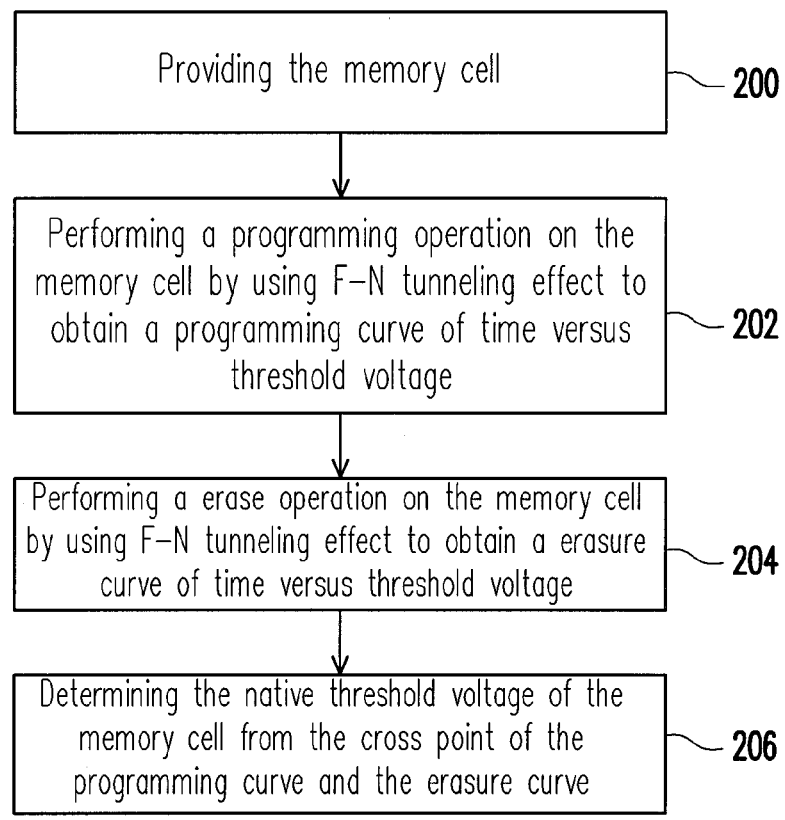
FIG. 4 is a flow diagram of a method of determining a native threshold voltage of a nonvolatile memory according to an embodiment in the present invention.

FIG. 4 is a flow diagram of a method of determining a native threshold voltage of a nonvolatile memory according to an embodiment in the present invention.

Referring to FIG. 4, firstly, a memory cell is provided (step 200). This memory cell has the structures illustrated in FIG. 1A and FIG. 1B, for example, and includes a control gate, a charge storage layer, a source region, and a drain region. The memory cell is, for example, a flash memory cell.

Next, a programming operation is performed on the memory cell by using an F-N tunneling effect to obtain a programming curve of time versus threshold voltage. In the programming operation, as illustrated in FIG. 1A, a voltage +VG is applied to the control gate, and the substrate 100, the source region 110, and the drain region 112 are grounded or applied with a 0V voltage.

Thereafter, an erase operation is performed on the memory cell (step 204) by using the F-N tunneling effect to obtain an erasure curve of time versus threshold voltage. In the erase operation, as illustrated in FIG. 1B, a voltage −VG is applied to the control gate, and the substrate 100, the source region 110, and the drain region 112 are grounded or applied with a 0V voltage. In other words, in the method of determining the native threshold voltage of the nonvolatile memory in the present invention, the absolute values of the voltages applied to the control gate in the programming operation and in the erase operation must be the same, but the polarities of the voltages applied are opposite.

Moreover, the native threshold voltage of the memory cell is determined from a cross point of the programming curve and the erasure curve (step 206).

Subsequently, the effectiveness of the method of determining the native threshold voltage of the nonvolatile memory in the present invention is illustrated according to the experiments.

Figure 5:
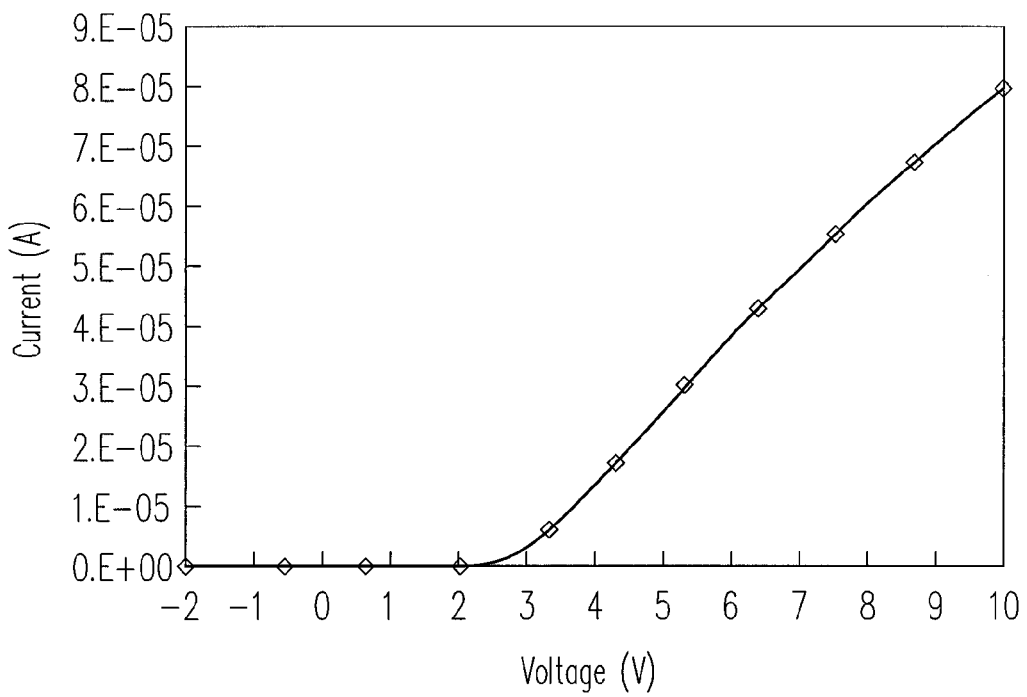
FIG. 5 is a current voltage curve determined from the manufactured nonvolatile memory after the UV light irradiation.

FIG. 5 is a current voltage curve determined from the manufactured nonvolatile memory after the UV light irradiation. As illustrated in FIG. 5, after the manufacture, the nonvolatile memory is initialized by the UV light irradiation. Here, the native threshold voltage determined is about 2.5V.

Figure 6:
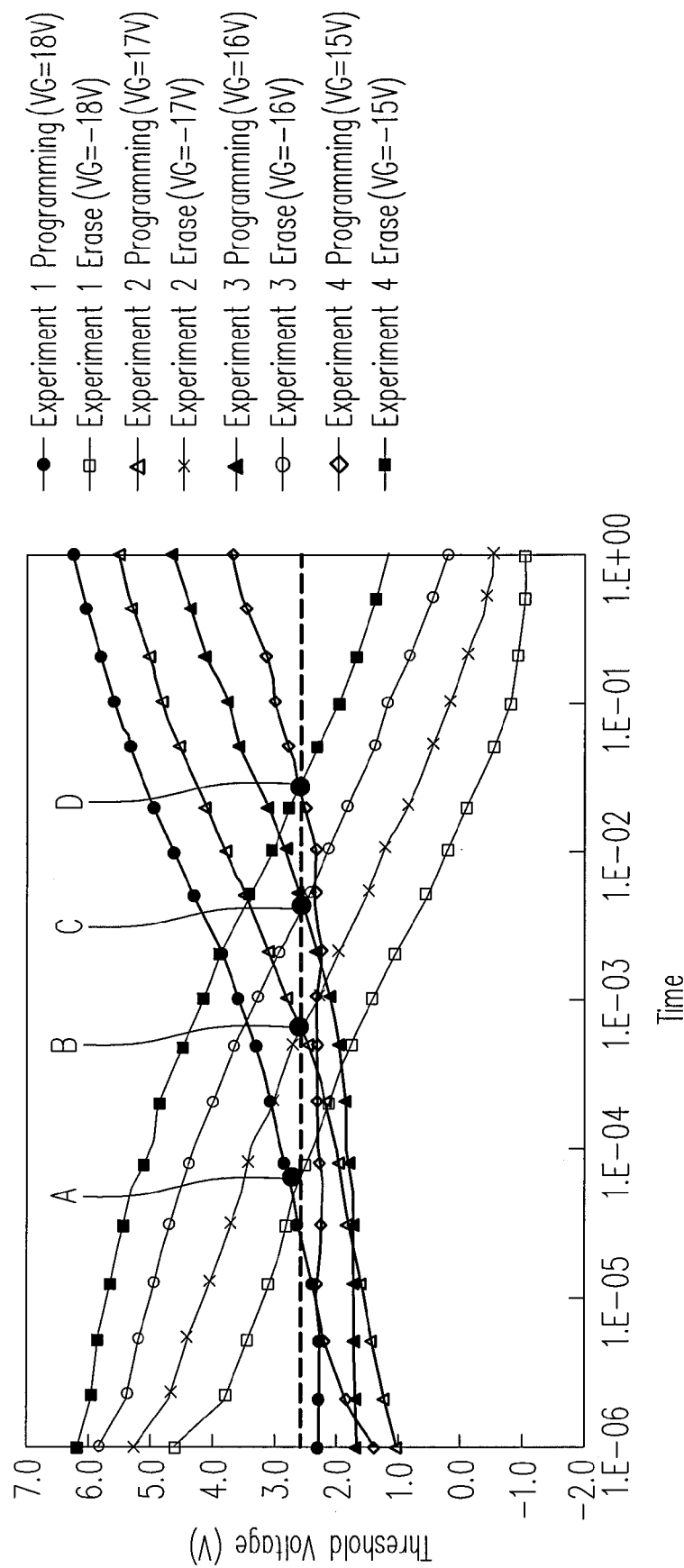
FIG. 6 illustrates a relationship of time and threshold voltage when the programming operation or the erase operation is performed under different operation bias voltages.

FIG. 6 illustrates a relationship of time and threshold voltage when the programming operation or the erase operation is performed under different operation bias voltages. In the following illustration, in the programming operation, a voltage applied to the control gate is called a programming voltage; in the erase operation, a voltage applied to the control gate is called an erase voltage. The results of 4 experiments are shown in FIG. 6. The operation condition of each experiment is as follows.

In experiment 1, the programming voltage is +18V, and the programming curve is shown (symbol ●); the erase voltage is −18V, and the erasure curve is displayed (symbol □).

In experiment 2, the programming voltage is +17V, and the programming curve is shown (symbol Δ); the erase voltage is −17V, and the erasure curve is displayed (symbol ×).

In experiment 3, the programming voltage is +16V, and the programming curve is shown (symbol ▲); the erase voltage is −16V, and the erasure curve is displayed (symbol ○).

In experiment 4, the programming voltage is +15V, and the programming curve is shown (symbol ◊); the erase voltage is −15V, and the erasure curve is displayed (symbol ■).

As illustrated in FIG. 6, in experiment 1, a cross point A of the programming curve (symbol ●) and the erasure curve (symbol □) has a corresponding threshold voltage value about 2.52V. In experiment 2, a cross point B of the programming curve (symbol △) and the erasure curve (symbol ×) has a corresponding threshold voltage value about 2.5V. In experiment 3, a cross point C of the programming curve (symbol ▲) and the erasure curve (symbol ○) has a corresponding threshold voltage value about 2.49V. In experiment 4, a cross point D of the programming curve (symbol ◇) and the erasure curve (symbol ■) has a corresponding threshold voltage value about 2.5V.

Based on the results of experiments 1-4, the threshold voltage values (2.52V, 2.5V, 2.49V, 2.5V) corresponding to the cross points A, B, C, D of the programming curve and the erasure curve are very close to the native threshold voltage value (2.5V) of the memory cell. Hence, the native threshold voltage of the nonvolatile memory can be easily determined by using the method of the present invention.

In summary, the method of determining the native threshold voltage of the nonvolatile memory in the present invention utilizes the F-N tunneling effect to perform a programming operation and an erase operation. Thereafter, a relationship of time versus threshold voltage is obtained from the programming operation and the erase operation. Herein, the native threshold voltage of the memory can be easily determined from the cross point of the programming curve and the erasure curve. As only one programming operation and one erasure operation are performed, the native threshold voltage of the nonvolatile memory can be determined easily by using the method of the present invention.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of determining a native threshold voltage of a nonvolatile memory, comprising:
    providing a memory cell, wherein the memory cell comprises a control gate, a charge storage layer, a source region, and a drain region;
    performing a programming operation on the memory cell by using a Fowler-Nordheim tunneling effect to obtain a programming curve of time versus threshold voltage, and applying a first voltage to the control gate in the programming operation;
    performing an erase operation on the memory cell by using the Fowler-Nordheim tunneling effect to obtain an erasure curve of time versus threshold voltage, and applying a second voltage to the control gate in the erase operation, wherein absolute values of the second voltage and the first voltage are the same, but polarities of the second voltage and the first voltage are opposite; and
    determining the native threshold voltage of the memory cell from a cross point of the programming curve and the erasure curve.

2. The method of determining the native threshold voltage of the nonvolatile memory as claimed in claim 1, wherein the first voltage is between 8V and 20V.

3. The method of determining the native threshold voltage of the nonvolatile memory as claimed in claim 1, wherein the second voltage is between −8V and −20V.

4. The method of determining the native threshold voltage of the nonvolatile memory as claimed in claim 1, wherein the source region and the drain region are grounded or applied with a voltage of 0V in the programming operation.

5. The method of determining the native threshold voltage of the nonvolatile memory as claimed in claim 1, wherein the source region and the drain region are grounded or applied with a voltage of 0V in the erase operation.

6. The method of determining the native threshold voltage of the nonvolatile memory as claimed in claim 1, wherein the memory cell is a flash memory cell.

* * * * *